US010157793B2

(12) United States Patent
Morikazu et al.

(10) Patent No.: US 10,157,793 B2
(45) Date of Patent: Dec. 18, 2018

(54) METHOD OF PROCESSING SINGLE-CRYSTAL SUBSTRATE

(71) Applicant: DISCO CORPORATION, Tokyo (JP)

(72) Inventors: Hiroshi Morikazu, Tokyo (JP); Noboru Takeda, Tokyo (JP); Takumi Shotokuji, Tokyo (JP)

(73) Assignee: DISCO CORPORATION, Tokyo (JP)

(*) Notice: Subject to any disclaimer, the term of this patent is extended or adjusted under 35 U.S.C. 154(b) by 236 days.

(21) Appl. No.: 15/065,499

(22) Filed: Mar. 9, 2016

(65) Prior Publication Data

US 2016/0270151 A1    Sep. 15, 2016

(30) Foreign Application Priority Data

Mar. 10, 2015  (JP) .................................. 2015-047150

(51) Int. Cl.
| | | |
|---|---|---|
| H01L 21/78 | (2006.01) | |
| B23K 26/53 | (2014.01) | |
| H01L 21/67 | (2006.01) | |
| B23K 103/00 | (2006.01) | |

(52) U.S. Cl.
CPC .............. *H01L 21/78* (2013.01); *B23K 26/53* (2015.10); *H01L 21/67092* (2013.01); *H01L 21/67132* (2013.01); *B23K 2203/56* (2015.10)

(58) Field of Classification Search
CPC ..... H05B 1/0233; H01L 21/78; H01L 21/268; B23K 1/0233; B23K 26/0057

USPC ............ 219/121.62, 121.67, 121.69, 121.72; 428/43, 66.7, 137, 192
See application file for complete search history.

(56) References Cited

U.S. PATENT DOCUMENTS

2009/0250446 A1* 10/2009 Sakamoto .............. B28D 1/221
219/121.72

FOREIGN PATENT DOCUMENTS

| JP | 10305420 A | 11/1998 | |
|---|---|---|---|
| JP | 2002118081 A | * 4/2002 | ......... H01L 21/2007 |
| JP | 2002192370 A | 7/2002 | |
| JP | 2014225562 A | * 12/2014 | |

* cited by examiner

*Primary Examiner* — Thien S Tran
(74) *Attorney, Agent, or Firm* — Greer Burns & Crain, Ltd.

(57) ABSTRACT

A single-crystal substrate having a film deposited on a surface thereof is processed to divide the single-crystal substrate along a plurality of preset division lines, including a shield tunnel forming step of applying a pulsed laser beam having such a wavelength that permeates through the single-crystal substrate to the single-crystal substrate from a reverse side thereof along the division lines to form shield tunnels, each including a fine hole and an amorphous region shielding the fine hole, in the single-crystal substrate along the division lines, a film removing step of removing the film deposited on the single-crystal substrate along the division lines, and a dividing step of exerting an external force on the single-crystal substrate to which the shield tunnel forming step and the film removing step are performed to divide the single-crystal substrate along the division lines along which the shield tunnels have been formed.

13 Claims, 14 Drawing Sheets

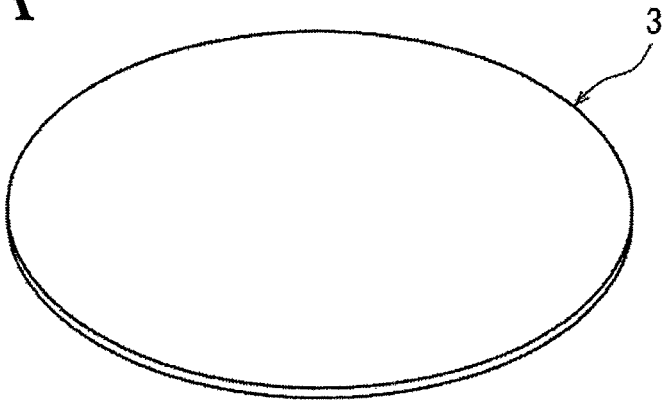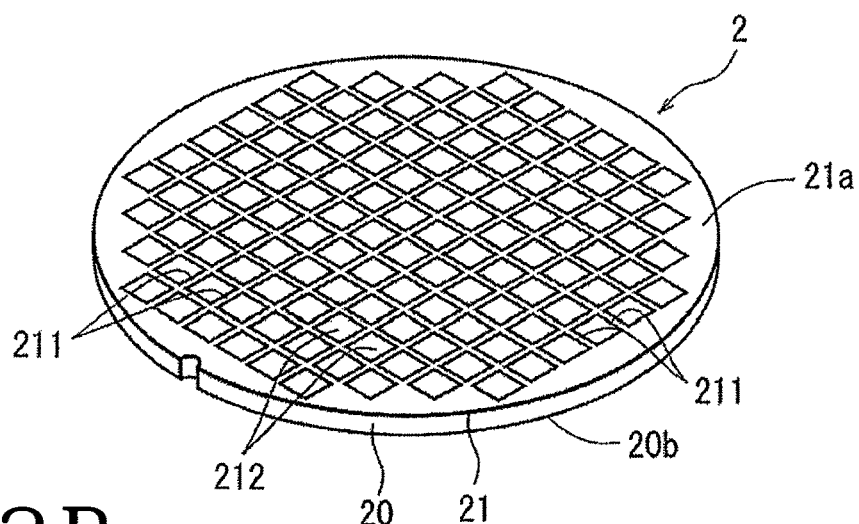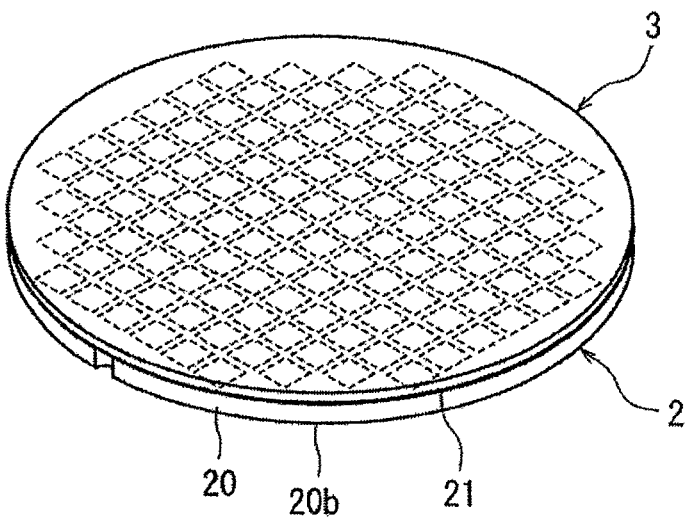

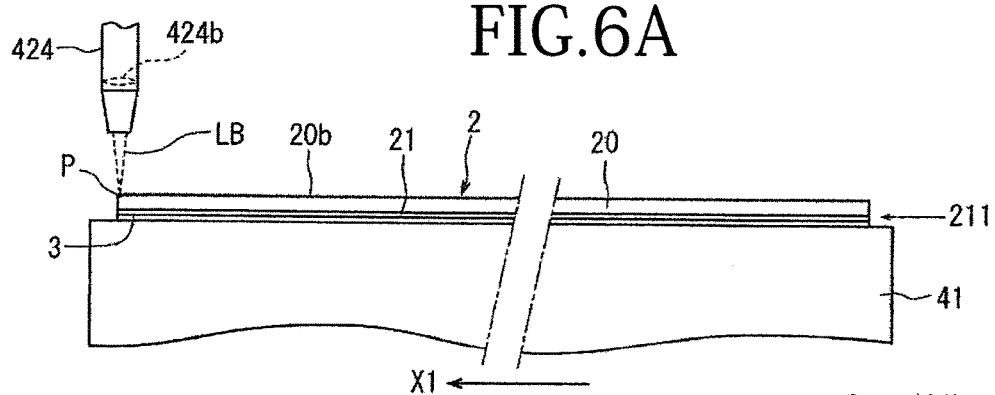
FIG.6A
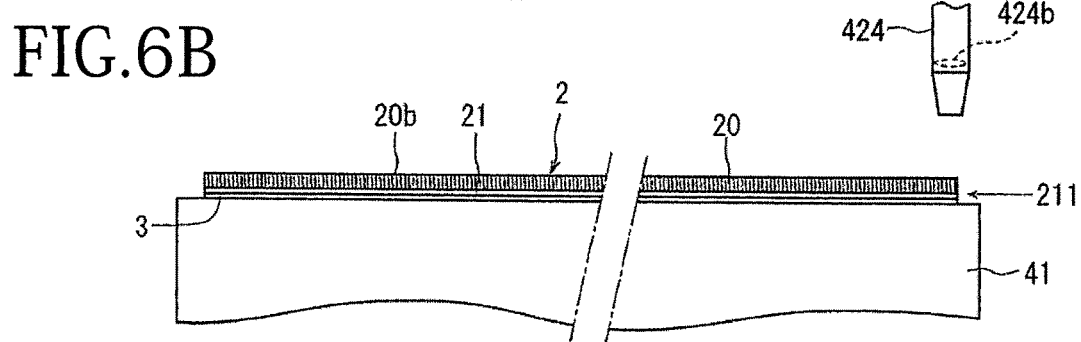
FIG.6B
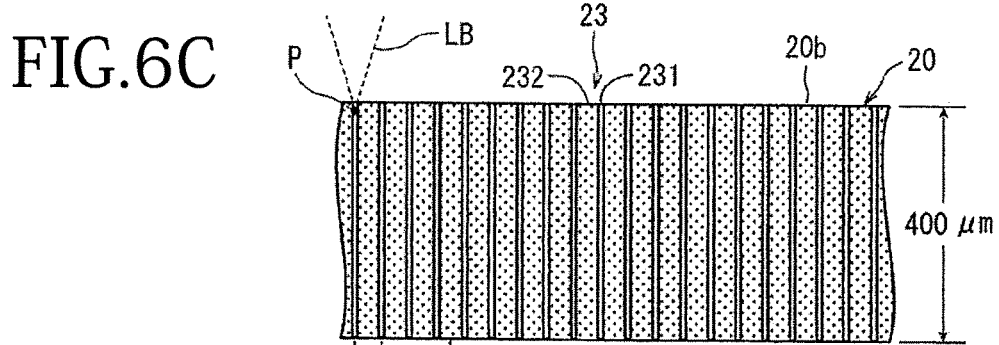
FIG.6C
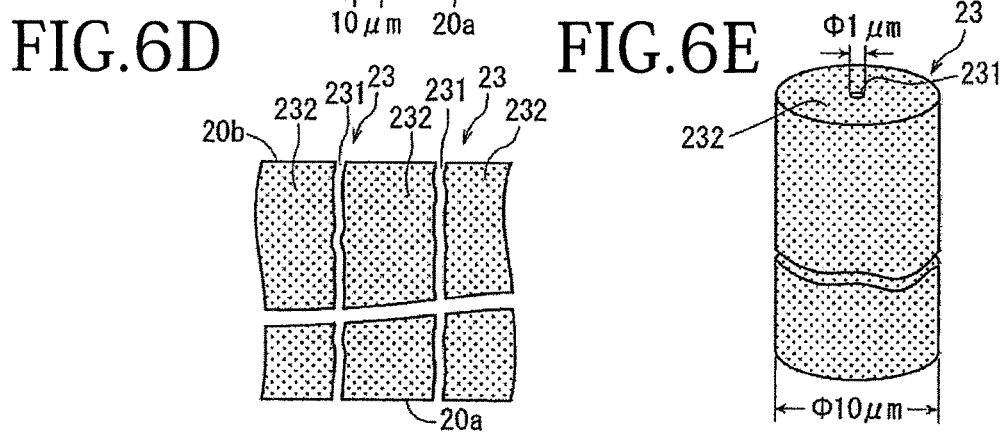
FIG.6D
FIG.6E

METHOD OF PROCESSING SINGLE-CRYSTAL SUBSTRATE

BACKGROUND OF THE INVENTION

Field of the Invention

The present invention relates to a method of processing a single-crystal substrate such as a sapphire ($Al_2O_3$) substrate, a silicon carbide (SiC) substrate, a gallium nitride (GaN) substrate, a lithium tantalate ($LiTaO_3$) substrate, a lithium niobate ($LiNbO_3$) substrate, a diamond substrate, a quartz substrate, or the like.

Description of the Related Art

In an optical device fabrication process, an optical device layer made up of an n-type nitride semiconductor layer and a p-type nitride semiconductor layer is stacked on the surface of a sapphire ($Al_2O_3$) substrate, a silicon carbide (SiC) substrate, or a gallium nitride (GaN) substrate, and optical devices such as light-emitting diodes, laser diodes, or the like are formed in a plurality of regions divided by a plurality of division lines formed in a grid pattern on the optical device layer, thereby producing an optical device wafer. Then, a laser beam is applied to the optical device wafer along the division lines to cut the optical device wafer, dividing the regions with the optical devices formed therein thereby to manufacture individual optical devices. A SAW wafer with SAW devices formed on the surface of a lithium tantalate ($LiTaO_3$) substrate, a lithium niobate ($LiNbO_3$) substrate, a silicon carbide (SiC) substrate, a diamond substrate, or a quartz substrate is also cut into individual SAW devices by a laser beam applied to the SAW wafer along division lines.

As a method of dividing wafers such as optical device wafers and SAW wafers as described above, there has been tried a laser processing method that uses a pulsed laser beam having such a wavelength that permeates through the workpiece, wherein the pulsed laser beam is applied to the workpiece while positioning a converged point thereof within an area to be divided. A dividing process using such a laser processing method is a technology for dividing a wafer by applying a pulsed laser beam having such a wavelength that permeates through the wafer from one surface thereof while positioning a converged point thereof within the wafer thereby to form a succession of modified layers serving as rupture start points along a division line within the workpiece and exerting an external force on the wafer along a street where the strength is lowered by the modified layers (see, for example, Japanese Patent No. 3408805).

Furthermore, as a method of dividing a wafer such as a semiconductor wafer, an optical device wafer, or the like along a division line, there has been put to practical use a technology for performing an ablation process on a wafer by irradiating the wafer with a pulsed laser beam having a wavelength absorbable by the wafer along a division line thereby to form laser-processed grooves, and exerting an external force on the wafer along the division line where the laser-processed grooves have been formed as rupture start points, thereby splitting the wafer (see, for example, Japanese Patent Laid-Open No. 1998-305420).

SUMMARY OF THE INVENTION

However, either one of the above processing methods is problematic in that the productivity is poor because in order to divide an optical device wafer made of a sapphire ($Al_2O_3$) substrate or the like along a division line, it is necessary to apply a laser beam to the same division line a plurality of times. Moreover, a single-crystal substrate where an optical device layer (film) made up of an n-type nitride semiconductor layer and a p-type nitride semiconductor layer is formed on the surface thereof requires that the single-crystal substrate be laser-processed as desired without being affected by the films.

It is therefore an object of the present invention to provide a method of processing a single-crystal substrate with a film formed on the surface thereof in a manner to be able to laser-process the single-crystal substrate reliably to a desired thickness without being affected by the film.

In accordance with an aspect of the present invention, there is provided a method of processing a single-crystal substrate having a film deposited on a surface thereof to divide the single-crystal substrate along a plurality of preset division lines, including a shield tunnel forming step of applying a pulsed laser beam having such a wavelength that permeates through the single-crystal substrate to the single-crystal substrate from a reverse side thereof along the division lines to form shield tunnels, each including a fine hole and an amorphous region shielding the fine hole, in the single-crystal substrate along the division lines, a film removing step of removing the film deposited on the single-crystal substrate along the division lines, and a dividing step of exerting an external force on the single-crystal substrate to which the shield tunnel forming step and the film removing step are performed to divide the single-crystal substrate along the division lines along which the shield tunnels have been formed.

Preferably, the film removing step is performed by a cutting blade with an annular cutter on an outer circumference thereof. Preferably, the pulsed laser beam used in the shield tunnel forming step has a peak energy density set to a value in a range from 1 $TW/cm^2$ to 100 $TW/cm^2$.

In the method of processing a single-crystal substrate according to the present invention, the pulsed laser beam whose wavelength permeates through the single-crystal substrate with the film deposited on the surface thereof is applied to the single-crystal substrate from the reverse side thereof along the division lines to form shield tunnels, each including a fine hole and an amorphous region shielding the fine hole, in the single-crystal substrate along the division lines. Therefore, the shield tunnels can reliably be formed in the single-crystal substrate without being affected by the film even though the film is deposited on the surface of the single-crystal substrate, thereby allowing the single-crystal substrate to be divided reliably into individual chips.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 2A and 2B are views showing a protective tape adhering step according to a first embodiment of the present invention, of adhering a protective tape to the surface of an optical device layer of the optical device wafer shown in FIG. 1A;

FIGS. 6A through 6E are views illustrating a shield tunnel forming step;

DETAILED DESCRIPTION OF THE PREFERRED EMBODIMENTS

Figure 1A:
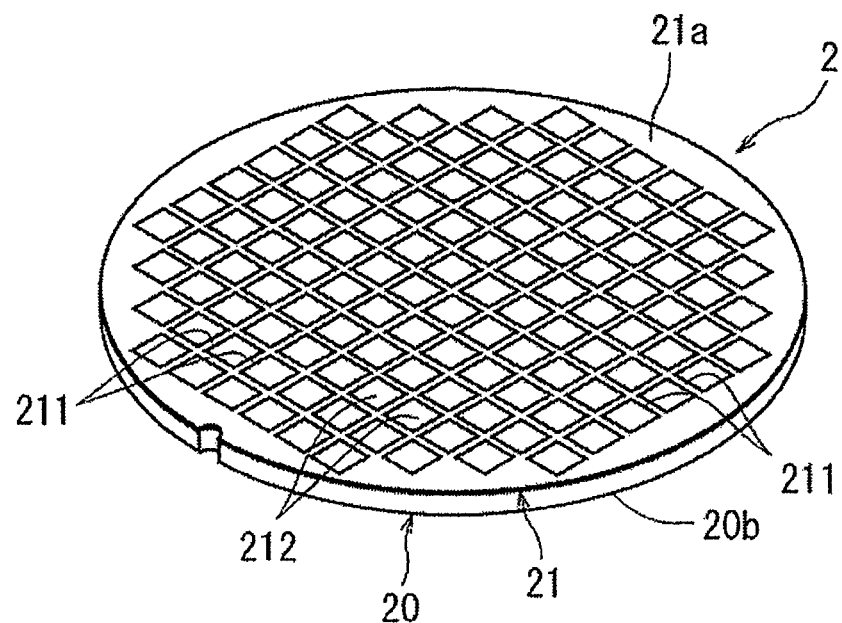
FIG. 1A is a perspective view of an optical device wafer.
Figure 1B:
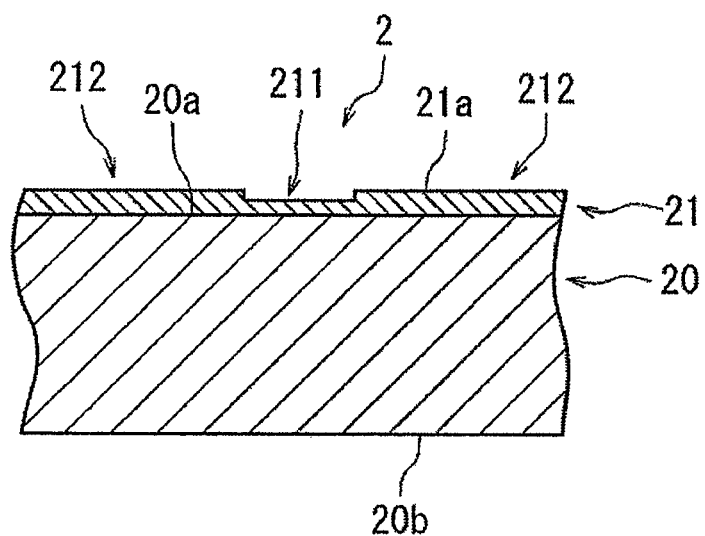
FIG. 1B is an enlarged fragmentary cross-sectional view of the optical device wafer shown in FIG. 1A.

Methods of processing a single-crystal substrate according to preferred embodiments of the present invention will be described in detail below with reference to the accompanying drawings. FIG. 1A shows in perspective an optical device wafer wherein an optical device layer is formed on a single-crystal substrate, which is to be processed by a method of processing a single-crystal substrate according to an embodiment of the present invention. As shown in FIGS. 1A and 1B, an optical device wafer 2 has an optical device layer 21 made up of an n-type gallium nitride semiconductor layer and a p-type gallium nitride semiconductor layer and deposited on a surface 20a of a sapphire ($Al_2O_3$) substrate 20 having a thickness of 400 μm by an epitaxial growth process. The optical device layer 21 includes a matrix of optical devices 212 formed in a plurality of areas that are separated by division lines 211 formed in a grid pattern.

A method of processing a single-crystal substrate according to a first embodiment of the present invention will be described below with reference to FIGS. 2A through 11C. First, in order to protect optical devices 212 formed on a surface 21a of the optical device layer 21 of the optical device wafer 2, a protective tape adhering step is carried out to adhere a protective tape to the surface 21a of the optical device layer 21. That is, a protective tape 3 is adhere to the surface 21a of the optical device layer 21 of the optical device wafer 2, as shown in FIG. 2. According to the present embodiment, the protective tape 3 includes an acrylic resin sheet having a thickness of 100 μm and an acrylic resin adhesive layer deposited to a thickness of about 5 μm on the surface of the acrylic resin sheet.

Figure 3:
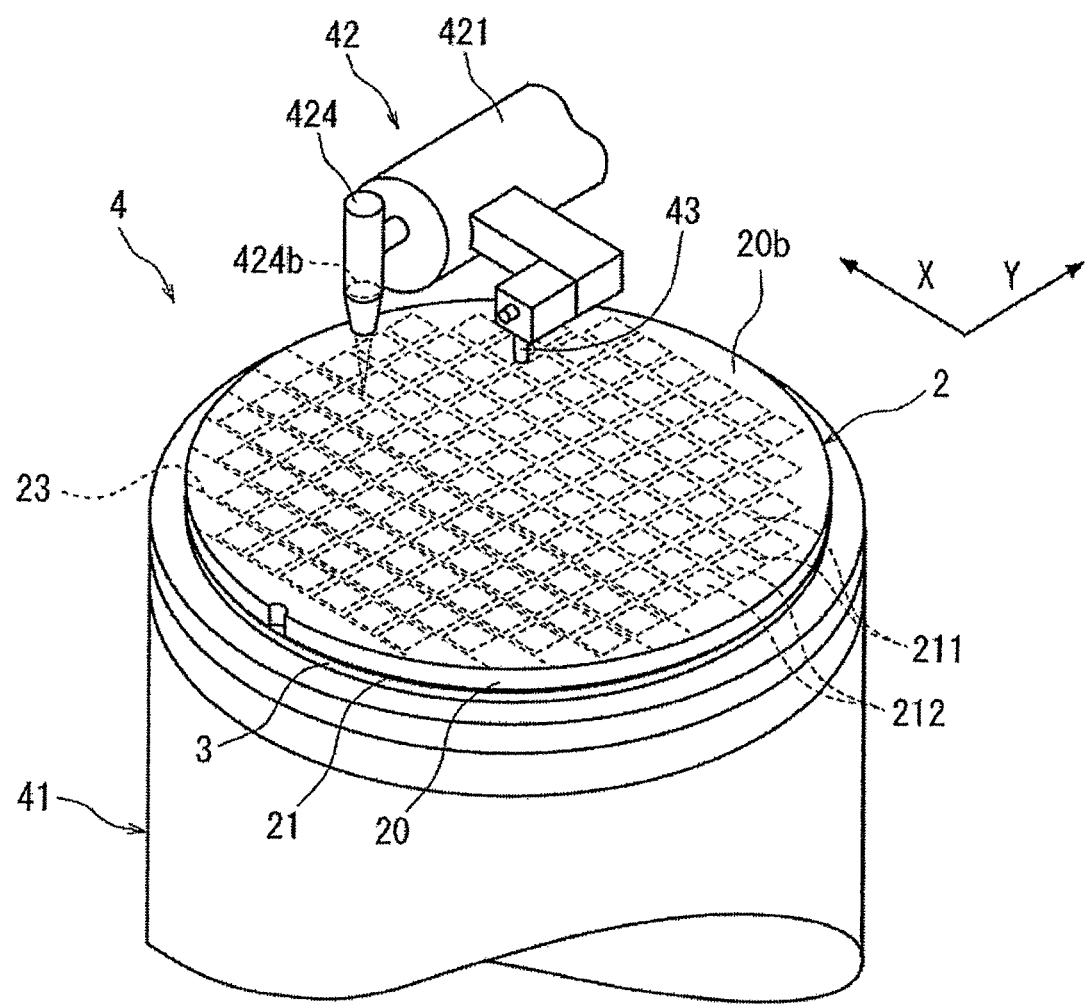
FIG. 3 is a perspective view of essential parts of a laser processing apparatus for performing a shield tunnel forming step.

After the protective tape adhering step has been performed, a shield tunnel forming step is carried out to apply a pulsed laser beam having such a wavelength that permeates through the sapphire ($Al_2O_3$) substrate 20 to the optical device wafer 2 from the reverse side thereof along the division lines 211, forming shield tunnels, each including a fine hole and an amorphous region shielding the fine hole, along the division lines 211. According to the present embodiment, the shield tunnel forming step is performed using a laser processing apparatus 4 shown in FIG. 3. As shown in FIG. 3, the laser processing apparatus 4 includes a chuck table 41 that holds a workpiece thereon, laser beam applying means 42 that applies a laser beam to the workpiece held on the chuck table 41, and image capturing means 43 that captures an image of the workpiece held on the chuck table 41. The chuck table 41, which is arranged to hold the workpiece under suction, is movable along a processing feed direction indicated by the arrow X in FIG. 3 by processing feed means, not shown, and along an indexing feed direction indicated by the arrow Y in FIG. 3 by indexing feed means, not shown.

Figure 4:
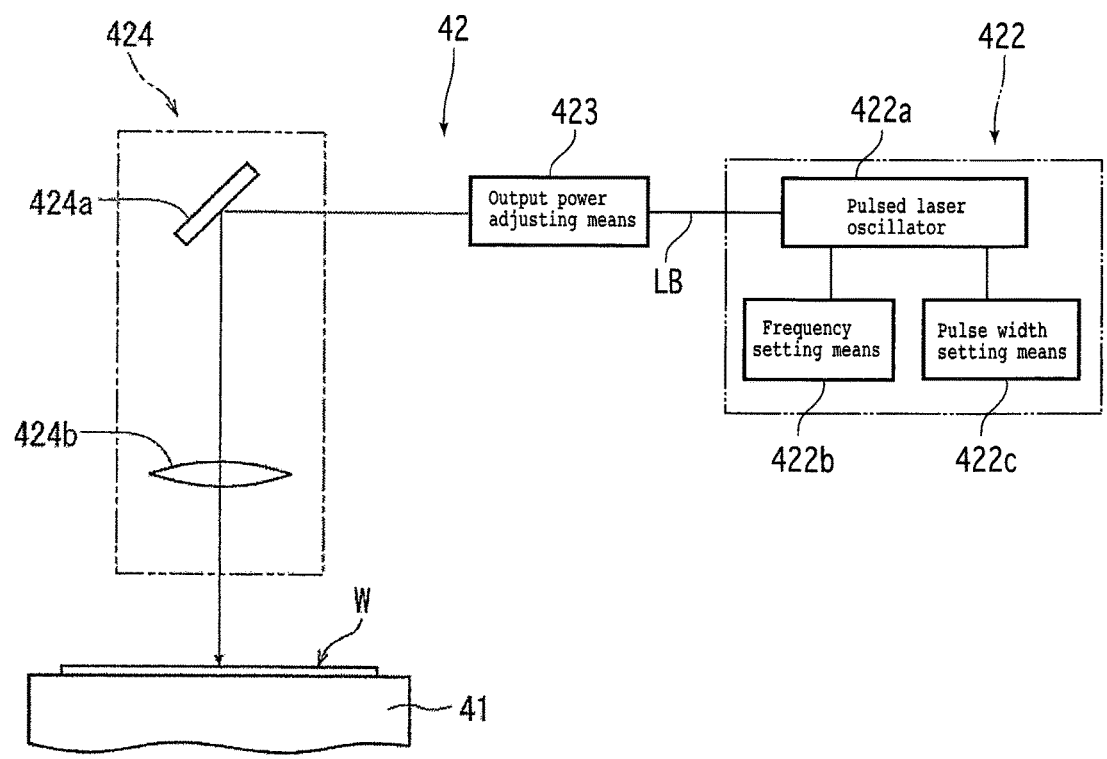
FIG. 4 is a block diagram of pulsed laser beam oscillating means included in the laser processing apparatus shown in FIG. 3.

The laser beam applying means 42 includes a casing 421 of a hollow cylindrical shape extending essentially horizontally. As shown in FIG. 4, the laser beam applying means 42 has pulsed laser beam oscillating means 422 disposed in the casing 421, output power adjusting means 423 for adjusting the output power of a pulsed laser beam emitted from the pulsed laser oscillating means 422, and a converging unit 424 for converging the pulsed laser beam whose output power has been adjusted by the output power adjusting means 423 and applying the converged pulsed laser beam to the optical device wafer 2 which is held as the workpiece on a holding surface that is provided as the upper surface of the chuck table 41. The pulsed laser beam oscillating means 422 includes a pulsed laser oscillator 422a, repetitive frequency setting means 422b for setting a repetitive frequency for the pulsed laser beam oscillated by the pulsed laser oscillator 422a, and pulse width setting means 422c for setting a pulse width for the pulsed laser beam oscillated by the pulsed laser oscillator 422a. According to the present embodiment, the pulsed laser beam oscillating means 422 thus arranged oscillates a pulsed laser beam LB having a wavelength of 1030 nm. The pulsed laser beam oscillating means 422 and the output power adjusting means 423 are controlled by control means, not shown.

The converging unit 424 includes a direction changing mirror 424a for changing the direction of the pulsed laser beam LB downwardly which has been emitted from the pulsed laser beam oscillating means 422 and whose output power has been adjusted by the output power adjusting means 423, and a condensing lens 424b for converging the pulsed laser beam LB which has been changed in direction by the direction changing mirror 424a and applying the converged pulsed laser beam to a workpiece W held on the holding surface as the upper surface of the chuck table 41. The present inventor has confirmed that a shield tunnel is formed insofar as a value generated by dividing the numerical aperture (NA) of the condensing lens 424b of the converging unit 424 by the refractive index (N) of the single-crystal substrate is in the range from 0.05 to 0.4. The relationship between the numerical aperture (NA), the refractive index (N), and the value (S=NA/N) generated by dividing the numerical aperture (NA) by the refractive index (N) will be described below with reference to FIG. 5.

Figure 5:
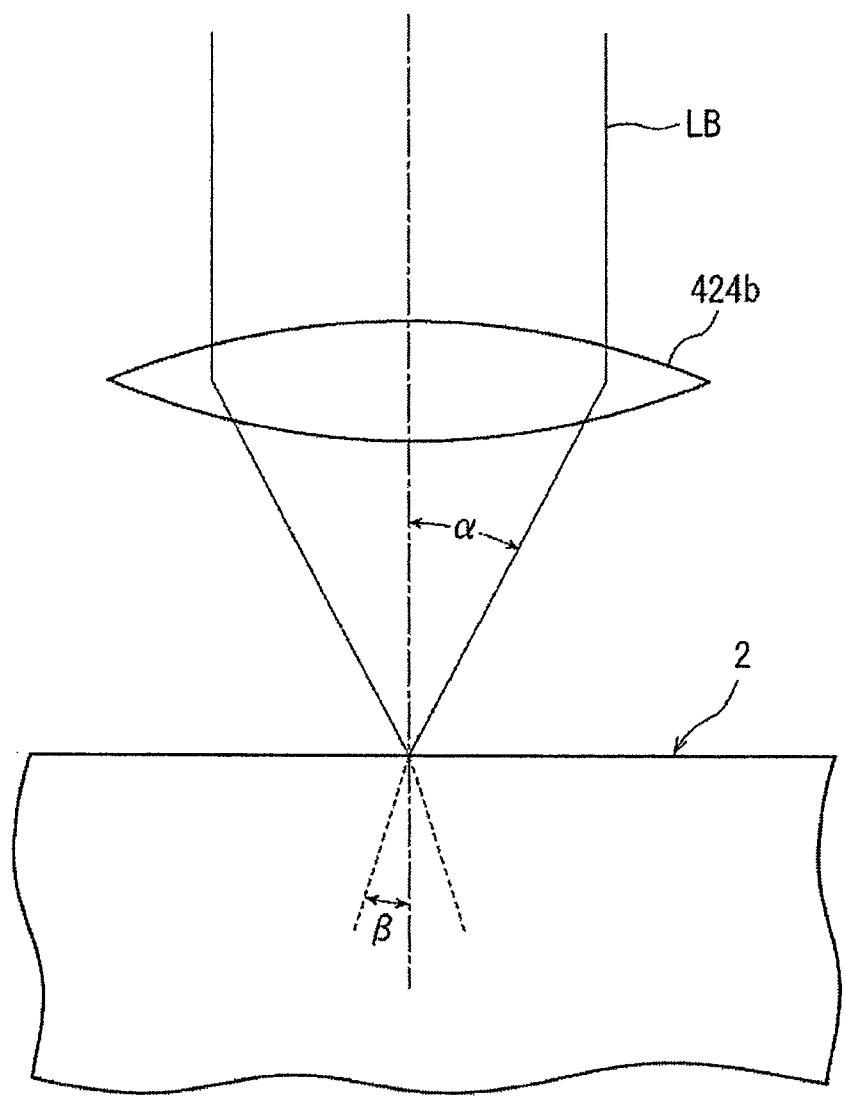
FIG. 5 is a diagram showing the relationship between the numerical aperture (NA) of a condensing lens, the refractive index (N) of an optical device wafer, and a value (S=NA/N) generated by dividing the numerical aperture (NA) by the refractive index (N)

In FIG. 5, the pulsed laser beam LB applied to the condensing lens 424b is converged at an angle (α) with respect to the optical axis of the condensing lens 424b. At this time, sin α represents the numerical aperture (NA) of the condensing lens 424b (NA=sin α). When the pulsed laser beam LB converged by the condensing lens 424b is applied to the optical device wafer 2 which includes the single-crystal substrate, since the single-crystal substrate of the optical device wafer 2 has its density higher than air, the pulsed laser beam LB is refracted from the angle (α) to an angle (β). At this time, the angle (β) with respect to the optical axis differs depending on the refractive index (N) of the single-crystal substrate of the optical device wafer 2. As the refractive index (N) is expressed as (N=sin α/sin β), the value (S=NA/N) generated by dividing the numerical aperture (NA) by the refractive index (N) of the single-crystal substrate is represented by sin β. It has been experimentally confirmed that a good shield tunnel is formed by setting sin β to the range from 0.05 to 0.4 (0.05≤sin β≤0.4), and that no good shield tunnel is formed if sin β falls outside the set range even though the peak energy density is in its desired range. The laser beam applying means 42 has converged point position adjusting means (not shown) for adjusting the position of the converged point of the pulsed laser beam that is converged by the condensing lens 424b of the converging unit 424.

The image capturing means 43, which is mounted on a distal end portion of the casing 421 of the laser beam applying means 42, includes, other than an ordinary image capturing device (CCD) which captures an image with a visible light beam, infrared radiation applying means for applying an infrared radiation to the workpiece, an optical system for capturing the infrared radiation applied by the infrared radiation applying means, and an image capturing device (infrared CCD) for outputting an electric signal depending on the infrared radiation captured by the optical system. The image capturing means 43 sends a captured image signal to the control means, not shown.

For laser-processing the optical device wafer 2, on which the protective tape adhering step has been performed, along the division lines 211 using the laser processing apparatus 4, the protective tape 3 to which the optical device wafer 2 has been adhered is placed on the chuck table 41 of the laser processing apparatus 4 shown in FIG. 3. Suction means, not shown, is actuated to hold the optical device wafer 2 on the chuck table 41 under suction through the intermediary of the protective tape 3 (wafer holding step). With the optical device wafer 2 held on the chuck table 41, therefore, the sapphire (Al$_2$O$_3$) substrate 20 has its reverse side 20b facing upwardly. The chuck table 41 which has thus held the optical device wafer 2 under suction is positioned immediately below the image capturing means 43 by the processing feed means, not shown.

When the chuck table 41 is positioned immediately below the image capturing means 43, the image capturing means 43 and the non-illustrated control means carry out an alignment process to detect an area to be laser-processed of the optical device wafer 2. Specifically, the image capturing means 43 and the non-illustrated control means perform an image processing process such as pattern matching or the like to position a division line 211 along a first direction on the optical device wafer 2 and the converging unit 424 of the laser beam applying means 42 which applies the laser beam along the division line 211, with respect to each other, thereby aligning a laser beam applying position (alignment step). A laser beam applying position is similarly aligned with respect to a division line 211 that extends on the optical device wafer 2 perpendicularly to the above first direction. In the alignment step, the optical device layer 21 where the division line 211 and the optical devices 212 are formed on the optical device wafer 2 is positioned downwardly. Since the image capturing means 43 includes the infrared radiation applying means, the optical system for capturing the infrared radiation, and the image capturing device (infrared CCD) for outputting an electric signal depending on the infrared radiation, as described above, the image capturing means 43 can capture an image of the division line 211 through the sapphire (Al$_2$O$_3$) substrate 20 as a single-crystal substrate.

After the above alignment step has been carried out, as shown in FIG. 6A, the chuck table 41 is moved to a laser beam applying area where the converging unit 424 of the laser beam applying means 42 that applies the laser beam is positioned, positioning the predetermined division line 211 immediately below the converging unit 424. At this time, as shown in FIG. 6A, one end (left end in FIG. 6A) of the division line 211 on the optical device wafer 2 is positioned immediately below the converging unit 424. Then, the non-illustrated converged point position adjusting means is actuated to move the converging unit 424 along the optical axis in order to position a converged point P of the pulsed laser beam LB converged by the condensing lens 424b of the converging unit 424 at a desired position along the thickness-wise direction of the sapphire (Al$_2$O$_3$) substrate 20 from the reverse side 20b thereof (positioning step). According to the present embodiment, the converged point P of the pulsed laser beam LB is set to the desired position that is spaced from the reverse side 20b of the sapphire (Al$_2$O$_3$) substrate 20 to which the pulsed laser beam LB is applied (e.g., a position spaced 5 μm through 10 μm from the reverse side 20b toward the surface 20a).

After the positioning step has been carried out as described above, a shield tunnel forming step is carried out to operate the laser beam applying means 42 to emit the pulsed laser beam LB from the converging unit 424 and form, in the sapphire (Al$_2$O$_3$) substrate 20, a fine hole and an amorphous region shielding the fine hole which extend from a region in the vicinity of the converged point P (reverse side 20b) toward the surface 20a, thereby forming a shield tunnel in the sapphire (Al$_2$O$_3$) substrate 20. Specifically, while the converging unit 424 is emitting the pulsed laser beam LB which has such a wavelength that permeates through the sapphire (Al$_2$O$_3$) substrate 20 of the optical device wafer 2, the chuck table 41 is moved at a predetermined feed speed along the direction indicated by the arrow X1 in FIG. 6A (shield tunnel forming step). Then, as shown in FIG. 6B, when the other end (right end in FIG. 6B) of the division line 211 reaches the laser beam applying position of the converging unit 424 of the laser beam applying means 42, the laser beam applying means 42 stops applying the pulsed laser beam LB, and the chuck table 41 stops moving.

When the above shield tunnel forming step is carried out, as shown in FIG. 6C, fine holes 231 and amorphous regions 232 formed around the fine holes 231 are grown in the sapphire (Al$_2$O$_3$) substrate 20 such that they extend from a region in the vicinity of the converged point P (reverse side 20b) of the pulsed laser beam LB toward the surface 20a, thereby forming amorphous shield tunnels 23 at predetermined intervals (according to the present embodiment, intervals of 10 μm (processing feed speed: 1000 mm/second)/(repetitive frequency: 100 kHz)) along the division line 211.

As shown in FIGS. 6D and 6E, each of the shield tunnels 23 includes a centrally formed fine hole 231 having a diameter of about 1 μm and an amorphous region 232 having a diameter of about 10 μm disposed around the fine hole 231. According to the present embodiment, those amorphous regions 232 which are disposed adjacent to each other are joined to each other. Since the amorphous shield tunnels 23 formed in the shield tunnel forming step can be formed so as to extend from the reverse side 20b of the sapphire ($Al_2O_3$) substrate 20 as a single-crystal substrate of the optical device wafer 2 toward the surface 20a thereof, the pulsed laser beam LB may be applied only once even if the thickness of the sapphire ($Al_2O_3$) substrate 20 is large. Therefore, the productivity of the shield tunnels 23 is highly increased.

After the shield tunnel forming step has been carried out along the predetermined division line 211, the chuck table 41 is indexed by the interval between division lines 211 on the optical device wafer 2 along the direction indicated by the arrow Y (indexing step), and then the above shield tunnel forming step is performed. When the shield tunnel forming step has been carried out along all the division lines 211 that extend along the first direction, the chuck table 41 is turned 90 degrees, and then the shield tunnel forming step is carried out along the division lines 211 which extend along a direction perpendicular to the division lines 211 along the first direction.

In order to form good shield tunnels 23 in the above shield tunnel forming step, it is important to set the peak energy density of the pulsed laser beam LB to a value in a range from 1 $TW/cm^2$ to 100 $TW/cm^2$. The peak energy density can be determined as average output power (W)/{repetitive frequency (Hz)×spot area ($cm^2$)×pulse width (s)}.

The reasons why the peak energy density of the pulsed laser beam LB is set to a value in the range from 1 $TW/cm^2$ to 100 $TW/cm^2$ will be described below.

[Experiment 1]

Condition 1 . . . single-crystal substrate: sapphire substrate (having a thickness of 400 μm)

Condition 2 . . . the wavelength of the pulsed laser beam is set to 1030 nm

Condition 3 . . . the repetitive frequency of the pulsed laser beam is set to 100 kHz Condition 4 . . . the spot diameter of the pulsed laser beam is set to 10 μm Condition 5 . . . the average output power of the pulsed laser beam is set to 5 W Condition 6 . . . variable: the pulse width of the pulsed laser beam The pulsed laser beam was applied to the sapphire substrate while the pulse width was varied from 0.1 ps to 100 ps under the above conditions, and the processed state was observed.

When the pulse width ranged from 0.1 ps to 0.6 ps, voids were formed within the sapphire substrate.

When the pulse width ranged from 0.7 ps to 63 ps, shield tunnels including fine holes and amorphous regions shielding the fine holes were formed within the sapphire substrate.

When the pulse width ranged from 64 ps to 100 ps, the inside of the sapphire substrate was melted.

It can be seen from the above experimental results that shield tunnels including fine holes and amorphous regions shielding the fine holes are formed within the sapphire substrate when the pulse width is in the range from 0.7 ps to 63 ps.

Consequently, the peak energy density is determined with the pulse width in the range from 0.7 ps to 63 ps under the above conditions, and shield tunnels are formed by setting the peak energy density to a value in the range from 1 $TW/cm^2$ to 100 $TW/cm^2$.

[Experiment 2]

Condition 1 . . . single-crystal substrate: sapphire substrate (having a thickness of 400 μm)

Condition 2 . . . the wavelength of the pulsed laser beam is set to 1030 nm

Condition 3 . . . the pulse width is set to 10 ps

Condition 4 . . . the spot diameter of the pulsed laser beam is set to 10 μm

Condition 5 . . . the average output power of the pulsed laser beam is set to 5 W Condition 6 . . . variable: the repetitive frequency of the pulsed laser beam The pulsed laser beam was applied to the sapphire substrate while the repetitive frequency was varied from 1 kHz to 1000 kHz under the above conditions, and the processed state was observed.

When the repetitive frequency ranged from 1 kHz to 6 kHz, the inside of the sapphire substrate was broken and cracks were radially developed therein.

When the repetitive frequency ranged from 7 kHz to 640 kHz, shield tunnels including fine holes and amorphous regions shielding the fine holes were formed within the sapphire substrate.

When the repetitive frequency ranged from 650 kHz to 1000 kHz, voids were formed within the sapphire substrate and no shield tunnels were formed therein.

It can be seen from the above experimental results that shield tunnels including fine holes and amorphous regions shielding the fine holes are formed within the sapphire substrate when the repetitive frequency is in the range from 7 kHz to 640 kHz.

Consequently, the peak energy density is determined with the repetitive frequency in the range from 7 kHz to 640 kHz under the above conditions, and shield tunnels are formed by setting the peak energy density to a value in the range from 1 $TW/cm^2$ to 100 $TW/cm^2$.

The above described Experiment 1 and Experiment 2 were conducted on the sapphire ($Al_2O_3$) substrate. Experiments similar to Experiment 1 and Experiment 2 were also conducted on a silicon carbide (SiC) substrate, a gallium nitride (GaN) substrate, a lithium tantalate ($LiTaO_3$) substrate, a lithium niobate ($LiNbO_3$) substrate, a diamond substrate, and a quartz ($SiO_2$) substrate, each as a single-crystal substrate, and the results of those experiments were essentially the same.

Figure 7:
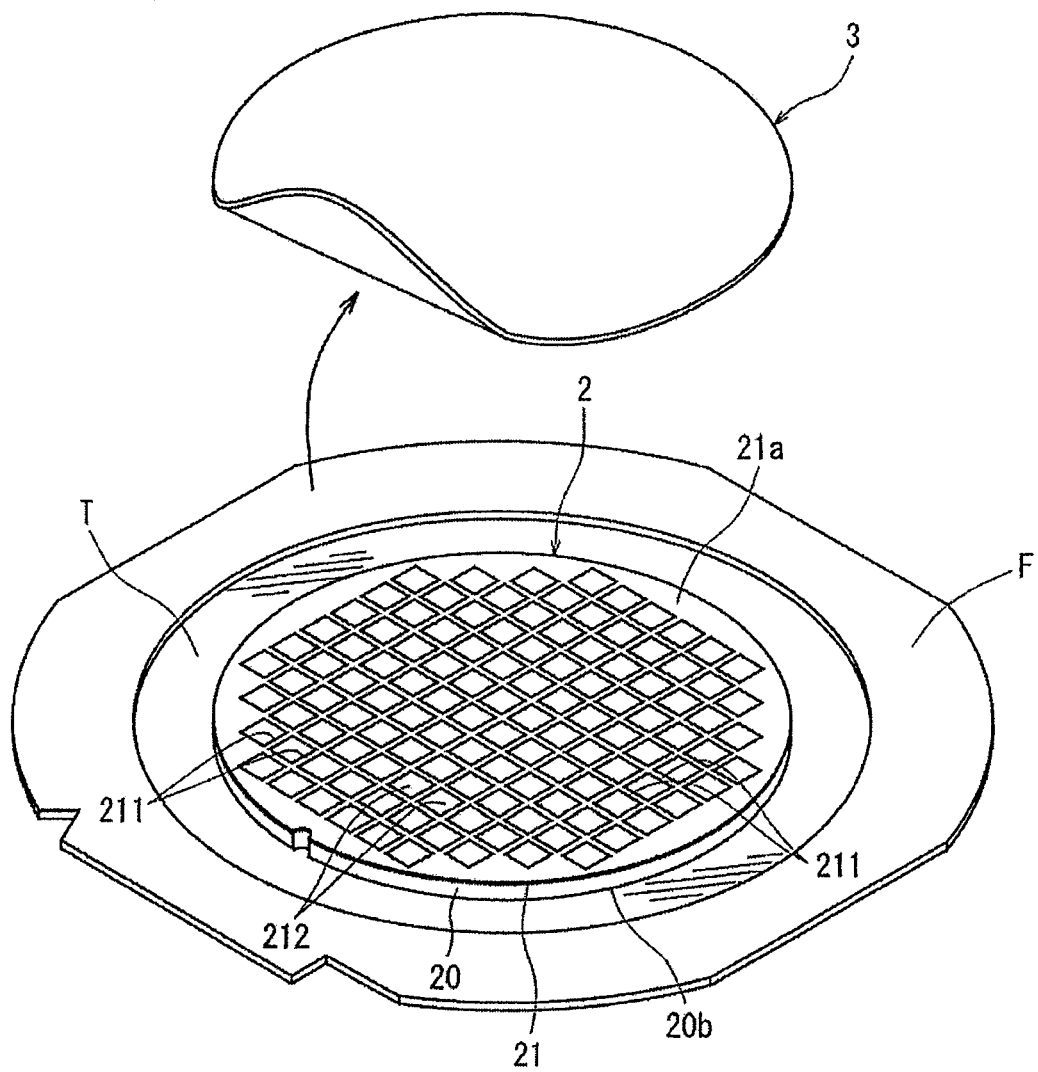
FIG. 7 is a perspective view showing the manner in which an optical device wafer on which the shield tunnel forming step has been performed is adhered to a dicing tape mounted on an annular frame.

After the above shield tunnel forming step has been carried out, a wafer supporting step is carried out to adhere a dicing tape to the reverse side 20b of the sapphire ($Al_2O_3$) substrate 20 as a single-crystal substrate of the optical device wafer 2 and support an outer circumferential portion of the dicing tape on an annular frame. Specifically, as shown in FIG. 7, the reverse side 20b of the sapphire ($Al_2O_3$) substrate 20 is adhered to the surface of a dicing tape T whose outer circumferential portion has been mounted on an annular frame F in covering relation to an inner opening thereof. Then, the protective tape 3 adhered to the surface 21a of the optical device layer 21 is peeled off. With the optical device wafer 2 adhered to the surface of the dicing tape T, therefore, the optical device layer 21 has its surface 21a facing upwardly.

Figure 8:
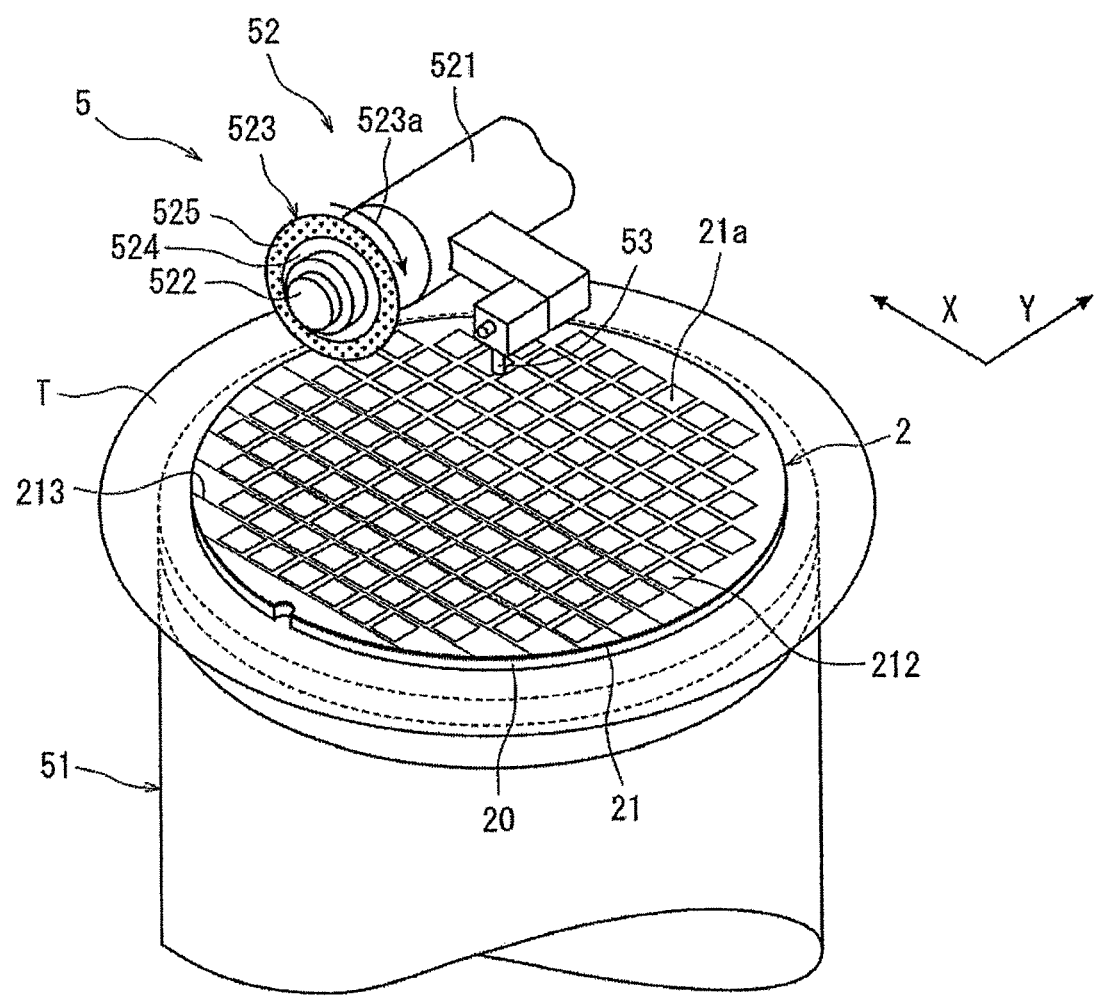
FIG. 8 is a perspective view of essential parts of a cutting apparatus for carrying out a film removing step.

Next, a film removing step is carried out to remove the optical device layer 21 which has been deposited as a film on the surface 20a of the sapphire ($Al_2O_3$) substrate 20, which is a single-crystal substrate of the optical device wafer 2, along division lines. According to the present embodiment, the film removing step is performed using a cutting apparatus 5 shown in FIG. 8. As shown in FIG. 8, the cutting apparatus 5 has a chuck table 51 that holds a workpiece thereon, cutting means 52 for cutting the workpiece that is held on the chuck table 51, and image capturing means 53 that captures an image of the workpiece held on the chuck table 51. The chuck table 51, which is arranged to hold the workpiece under suction, is movable along a processing feed direction indicated by the arrow X in FIG. 8 by processing feed means, not shown, and along an indexing feed direction indicated by the arrow Y in FIG. 8 by indexing feed means, not shown.

The cutting means 52 includes a spindle housing 521 disposed substantially horizontally, a rotational spindle 522 rotatably supported by the spindle housing 521, and a cutting blade 523 mounted on the distal end of the rotational spindle 522. The rotational spindle 522 is rotated about its own axis in the direction indicated by the arrow 523a by servomotor, not shown, housed in the spindle housing 521. The cutting blade 523 includes a disk-shaped base 524 made of a metal material such as aluminum or the like, and an annular cutter 525 mounted on the outer circumferential side surface of the base 524. The annular cutter 525 includes an electroformed blade disposed on the outer circumferential side surface of the base 524 and made of abrasive grains of diamond having particle diameters in the range from 3 μm to 4 μm and held together by nickel plating. According to the present embodiment, the annular cutter 525 has a thickness of 30 μm and an outside diameter of 50 mm.

The image capturing means 53, which is mounted on a distal end portion of the spindle housing 521, includes, illuminating means for illuminating the workpiece, an optical system for optically creating an image of the area of the workpiece illuminated by the illuminating means, and an image capturing device (CCD) for capturing the image optically created by the optical system. The image capturing means 53 sends a captured image signal to control means, not shown.

For carrying out the film removing step using the cutting apparatus 5, the dicing tape T to which the optical device wafer 2 has been adhered in the wafer supporting step is placed on the chuck table 51, as shown in FIG. 8. Suction means, not shown, is actuated to hold the optical device wafer 2 on the chuck table 51 under suction through the intermediary of the dicing tape T (wafer holding step). Therefore, the optical device layer 21 of the optical device wafer 2 held on the chuck table 51 has its surface 21a facing upwardly. The annular frame F with the dicing tape T mounted thereon, which is omitted from illustration in FIG. 8, is held by appropriate frame holding means disposed on the chuck table 51. The chuck table 51 which has thus held the optical device wafer 2 under suction is positioned immediately below the image capturing means 53 by the processing feed means, not shown.

When the chuck table 51 is positioned immediately below the image capturing means 53, the image capturing means 53 and the non-illustrated control means carry out an alignment step to detect an area to be laser-processed of the optical device wafer 2. Specifically, the image capturing means 53 and the non-illustrated control means perform an image processing process such as pattern matching or the like to position a division line 211 along a first direction on the optical device wafer 2 in alignment with the cutting blade 523, thereby aligning the area to be cut by the cutting blade 523 (alignment step). The area to be cut by the cutting blade 523 is also similarly aligned with a division line 211 that extends on the optical device wafer 2 perpendicularly to the above first direction.

After the division lines 211 on the optical device wafer 2 held on the chuck table 51 have been detected and the area to be cut has been aligned, the chuck table 51 which is holding the optical device wafer 2 is moved to a position where the area to be cut starts to be cut. At this time, as shown in FIG. 9A, one end (left end in FIG. 9A) of the division line 211 to be cut on the optical device wafer 2 is positioned at a location that is spaced a predetermined distance rightwardly from the position immediately below the cutting blade 523.

Figure 9A:
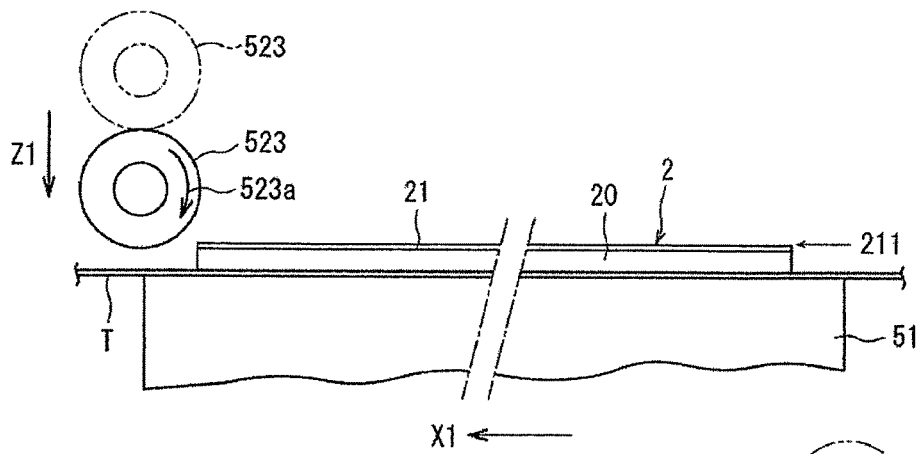
FIGS. 9A through 9D are views illustrating a film removing step according to the first embodiment of the present invention.

After the optical device wafer 2 held on the chuck table 51 of the cutting apparatus 5 has been positioned at a cutting start position of the area to be cut, the cutting blade 523 is advanced downwardly along the direction indicated by the arrow Z1 from a standby position indicated by the two-dot-and-dash lines in FIG. 9A, and positioned at a predetermined cut-in position indicated by the solid lines in FIG. 9A. As shown in FIGS. 9A and 9C, the cut-in position refers to a position where the cutting blade 523 has its lower end reaching the surface 20a of the sapphire ($Al_2O_3$) substrate 20 of the optical device wafer 2.

Then, the cutting blade 523 is rotated about its own axis at a predetermined rotational speed in the direction indicated by the arrow 523a in FIG. 9A, and the chuck table 51 is moved or fed at a predetermined cutting feed speed in the direction indicated by the arrow X1 in FIG. 9A. When the other end (right end in FIG. 9B) of the division line 211 reaches a position that is spaced a predetermined distance leftwardly from the position immediately below the cutting blade 523, the chuck table 51 stops moving. When the chuck table 51 is thus fed along the division line 211, there is formed a groove 213 that reaches the surface 20a of the sapphire ($Al_2O_3$) substrate 20 in the optical device layer 21 of the optical device wafer 2 along the division line 211, as shown in FIG. 9D. As a result, a portion of the optical device layer 21 as the film deposited on the surface 20a of the sapphire ($Al_2O_3$) substrate 20 is removed along the division line 211 (film removing step).

Figure 9B:
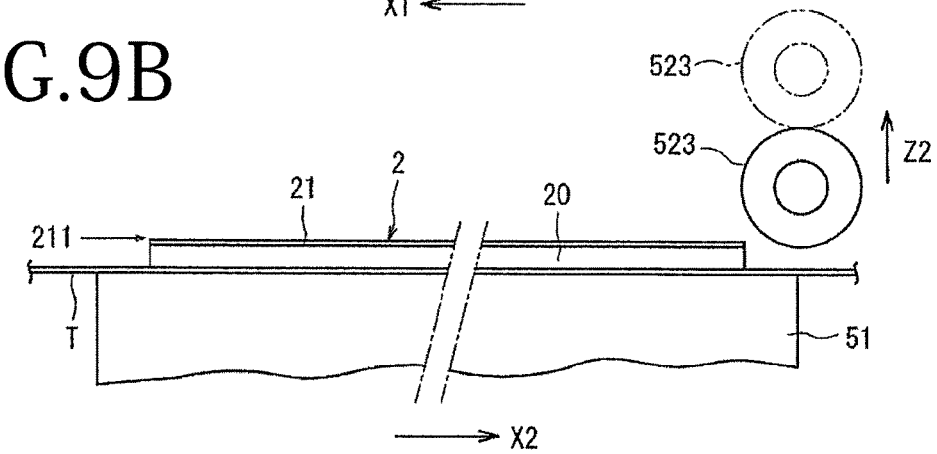
Figure 9C:
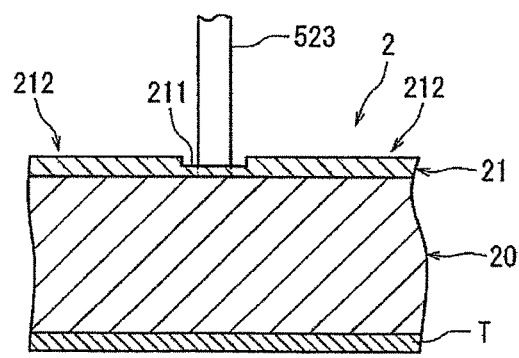
Figure 9D:
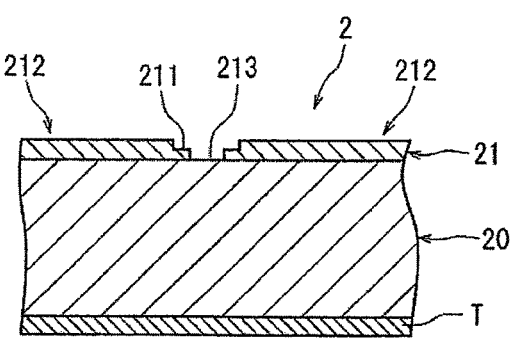

Then, the cutting blade 523 is lifted along the direction indicated by the arrow Z2 in FIG. 9B back to the standby position indicated by the two-dot-and-dash lines in FIG. 9B, and the chuck table 51 is moved in the direction indicated by the arrow X2 in FIG. 9B back to the position shown in FIG. 9A. Thereafter, the chuck table 51 is fed in a direction normal to the sheet of FIGS. 9A and 9B (indexing feed direction) by a distance corresponding to the interval between two adjacent division lines 211, positioning a next division line 211 along which to cut the optical device wafer 2 in alignment with the cutting blade 523. After the next division line 211 has been positioned in alignment with the cutting blade 523, the above film removing step is carried out again. The film removing step is performed along all the division lines 211 on the optical device wafer 2.

The film removing step is carried out under the following processing conditions, for example:

Cutting blade: an outside diameter of 50 mm and a thickness of 30 μm

Rotational speed of the cutting blade: 20000 rpm

Cutting feed speed: 50 mm/second

Figure 10:
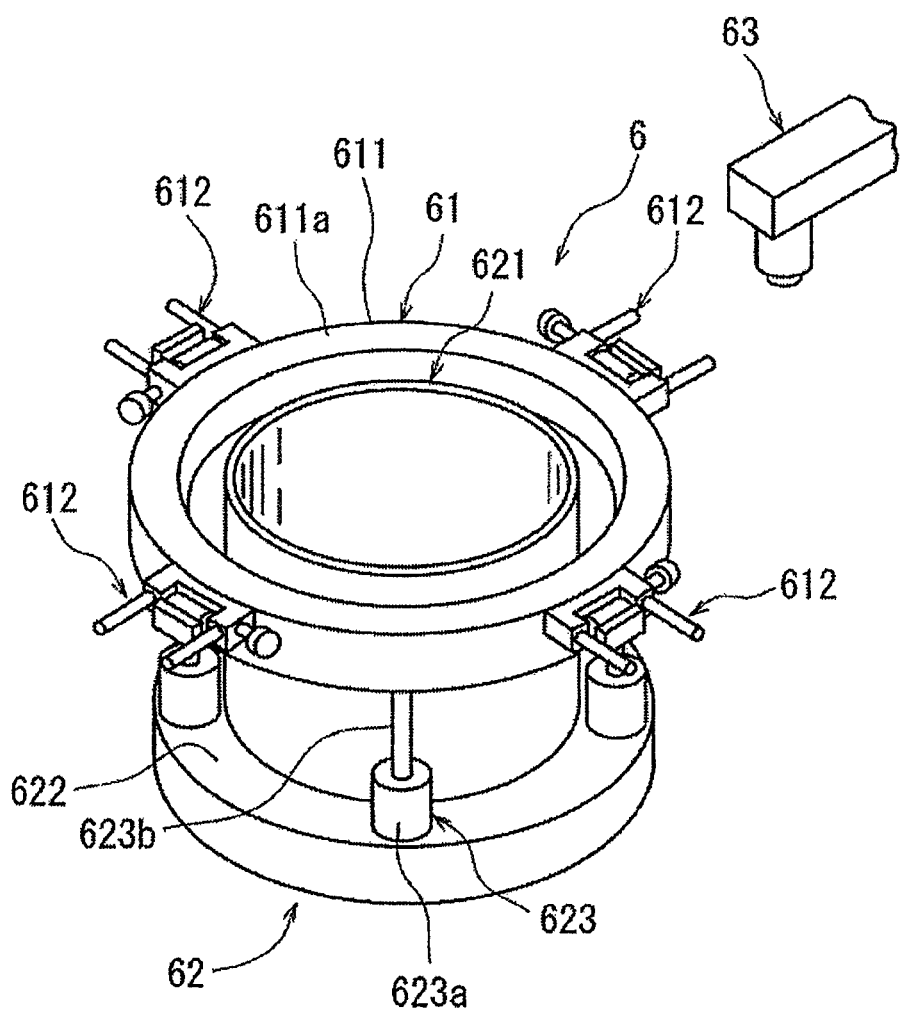
FIG. 10 is a perspective view of a dividing apparatus for dividing an optical device wafer wherein shield tunnels have been formed into individual optical devices.

After the above film removing step has been performed, a wafer dividing step is performed to apply an external force to the optical device wafer 2 to divide the optical device wafer 2 along the division lines 211 where the shield tunnels 23 including the fine holes 231 and the amorphous regions 232 formed around the fine holes 231 have been successively formed, into individual optical devices 212. The wafer dividing step is carried out using a dividing apparatus 6 shown in FIG. 10. As shown in FIG. 10, the dividing apparatus 6 includes frame holding means 61 for holding the annular frame F, tape expanding means 62 for expanding the optical device wafer 2 mounted on the annular frame F that is held by the frame holding means 61, and a pickup collet 63. The frame holding means 61 includes an annular frame holding member 611 and a plurality of clamps 612 disposed as fixing means on an outer circumferential surface of the frame holding member 611. The frame holding member 611 has an upper surface serving as a placement surface 611a for placing the annular frame F thereon. The annular frame F is placed on the placement surface 611a. The annular frame F that is placed on the placement surface 611a is fixed to the frame holding member 611 by the clamps 612. The frame holding means 61 thus constructed is supported by the tape expanding means 62 for vertical back-and-forth movement.

The tape expanding means 62 has an expanding drum 621 disposed in the annular frame holding member 611. The expanding drum 621 has an outside diameter smaller than the inside diameter of the annular frame F and an inside diameter larger than the outside diameter of the optical device wafer 2 adhered to the dicing tape T which is mounted on the annular frame F. The expanding drum 621 has a support flange 622 on its lower end. The tape expanding means 62 according to the present embodiment has support means 623 for vertically moving the annular frame holding member 611 back and forth. The support means 623 includes a plurality of air cylinders 623a disposed on the support flange 622 and having respective piston rods 623b connected to the lower surface of the annular frame holding member 611. The support means 623 which includes the air cylinders 623a moves the annular frame holding member 611 vertically between a reference position shown in FIG. 11A in which the placement surface 611a lies substantially at the same height as the upper end of the expanding drum 621 and an expanding position shown in FIG. 11B in which the placement surface 611a is a predetermined distance lower than the upper end of the expanding drum 621.

Figure 11A:
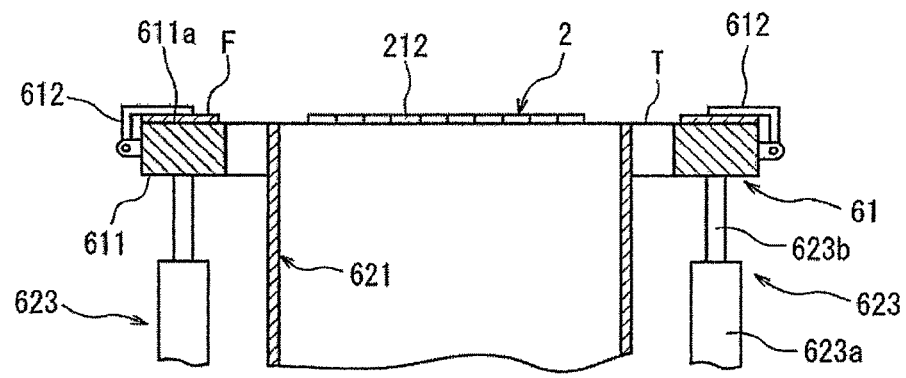
FIGS. 11A through 11C are views illustrating a wafer dividing step that is carried out by the dividing apparatus shown in FIG. 10.
Figure 11B:
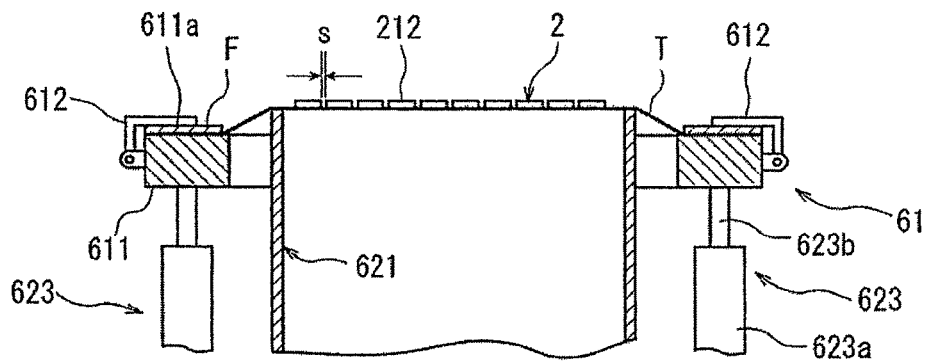

The wafer dividing step to be carried out using the dividing apparatus 6 thus constructed will be described below with reference to FIGS. 11A through 11C. As shown in FIG. 11A, the annular frame F on which the dicing tape T with the optical device wafer 2 adhered thereto is mounted is placed on the placement surface 611a of the frame holding member 611 of the frame holding means 61, and is then fixed to the frame holding member 611 by the clamps 612 (frame holding step). At this time, the frame holding member 611 is positioned in the reference position shown in FIG. 11A. Thereafter, the air cylinders 623a of the support means 623 of the tape expanding means 62 are actuated to lower the annular frame holding member 611 to the expanding position shown in FIG. 11B. Since the annular frame F fixed to the placement surface 611a of the frame holding member 611 is also lowered, the dicing tape T mounted on the annular frame F is expanded by contact with the upper end of the expanding drum 621 (tape expanding step), as shown in FIG. 11B. As a result, the optical device wafer 2 adhered to the dicing tape T is subjected to a radial tensile force which separates the individual optical devices 212 along the division lines 211 whose mechanical strength has been reduced by the shield tunnels 23 continuously formed therein, forming widened gaps S between the optical devices 212.

Figure 11C:
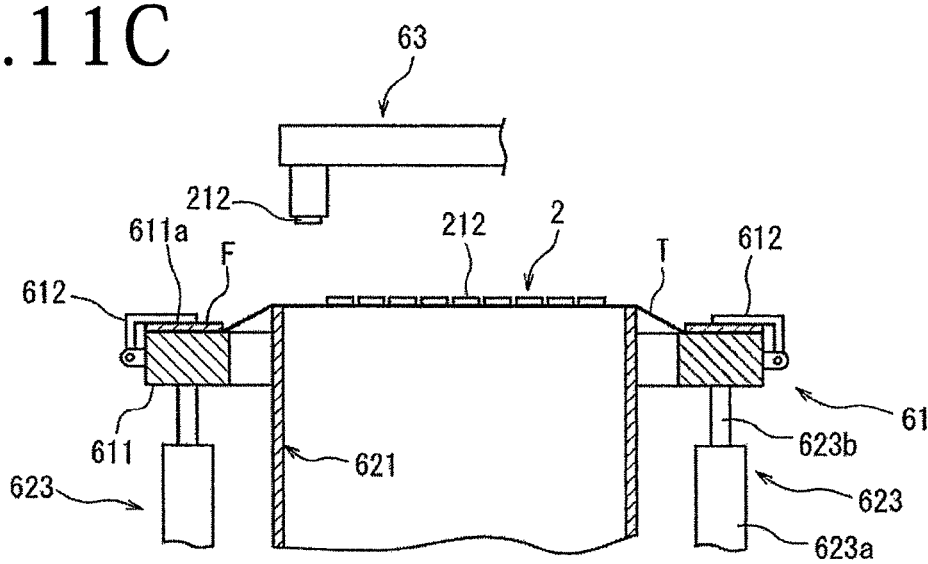

Then, as shown in FIG. 11C, the pickup collet 63 is actuated to attract one at a time of the optical devices 212 and pick it up from the dicing tape T (pickup step), and delivers the picked-up optical device 212 to a tray, not shown, or a die bonding step. In the pickup step, since the widened gaps S are formed between the individual optical devices 212 adhered to the dicing tape T as described above, the pickup collet 63 can easily pick up each optical device 212 without contact with the adjacent optical devices 212.

Figure 12A:
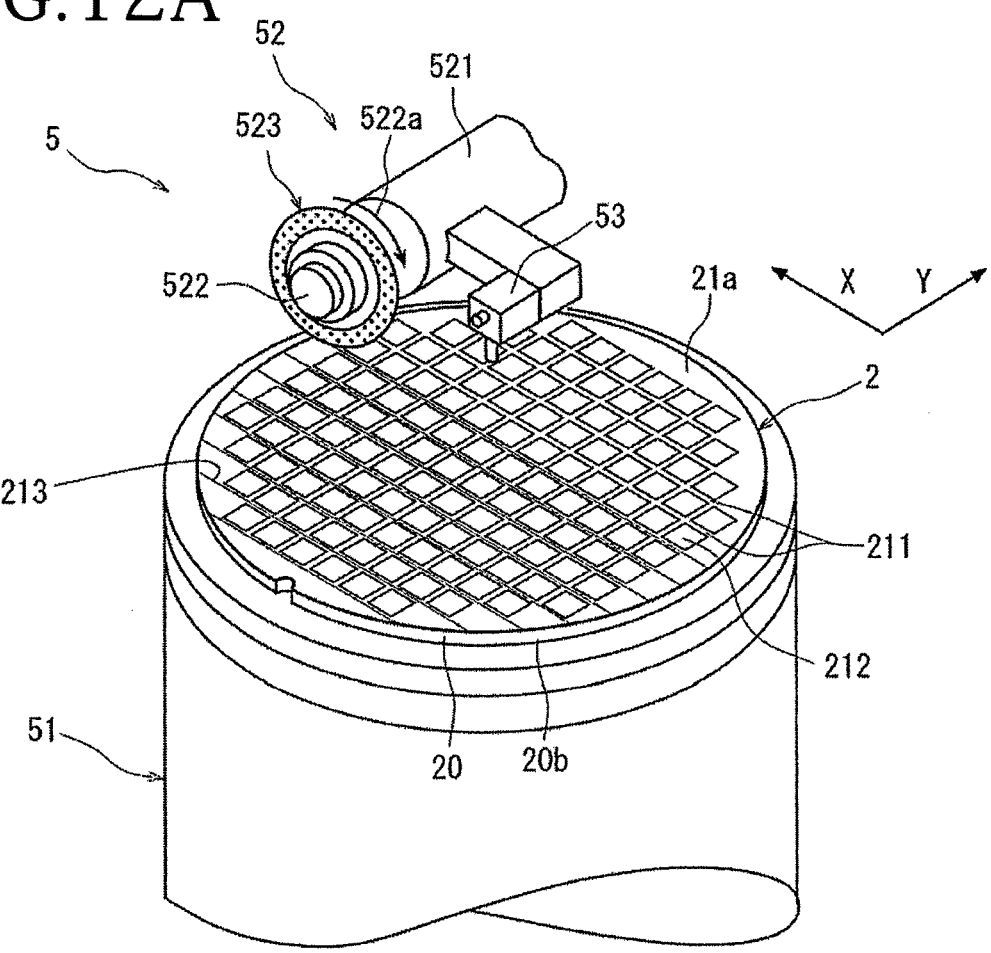
FIGS. 12A and 12B are views illustrating a film removing step according to a second embodiment of the present invention.
Figure 12B:
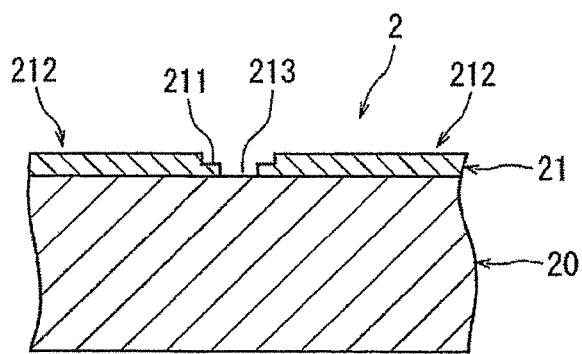

A method of processing a single-crystal substrate, i.e., the optical device wafer 2, according to a second embodiment of the present invention will be described below. The method according to the second embodiment is a method wherein the shield tunnel forming step and the film removing step of the method according to the first embodiment are switched around. Specifically, in the method of processing a single-crystal substrate according to the second embodiment, a film removing step is first carried out to remove the optical device layer 21 deposited as a film on the surface 20a of the sapphire ($Al_2O_3$) substrate 20 which serves as the single-crystal substrate of the optical device wafer 2, along the division lines 211. The film removing step is performed using the cutting apparatus 5 shown in FIG. 8. As shown in FIG. 12A, the reverse side 20b of the sapphire ($Al_2O_3$) substrate 20 is placed on the chuck table 51, and the suction means, not shown, is actuated to hold the optical device wafer 2 on the chuck table 51 under suction (wafer holding step). Therefore, the optical device layer 21 of the optical device wafer 2 held on the chuck table 51 has its surface 21a facing upwardly. After the wafer holding step has been carried out, a film removing step is carried out in the same manner as with the first embodiment described above with reference to FIGS. 8 and 9A through 9D. As a result, there is formed a groove 213 that reaches the surface 20a of the sapphire ($Al_2O_3$) substrate 20 in the optical device layer 21 of the optical device wafer 2 along the division line 211, as shown in FIG. 12B, removing a portion of the optical device layer 21 as the film deposited on the surface 20a of the sapphire ($Al_2O_3$) substrate 20 along the division line 211 (film removing step).

Figure 13A:
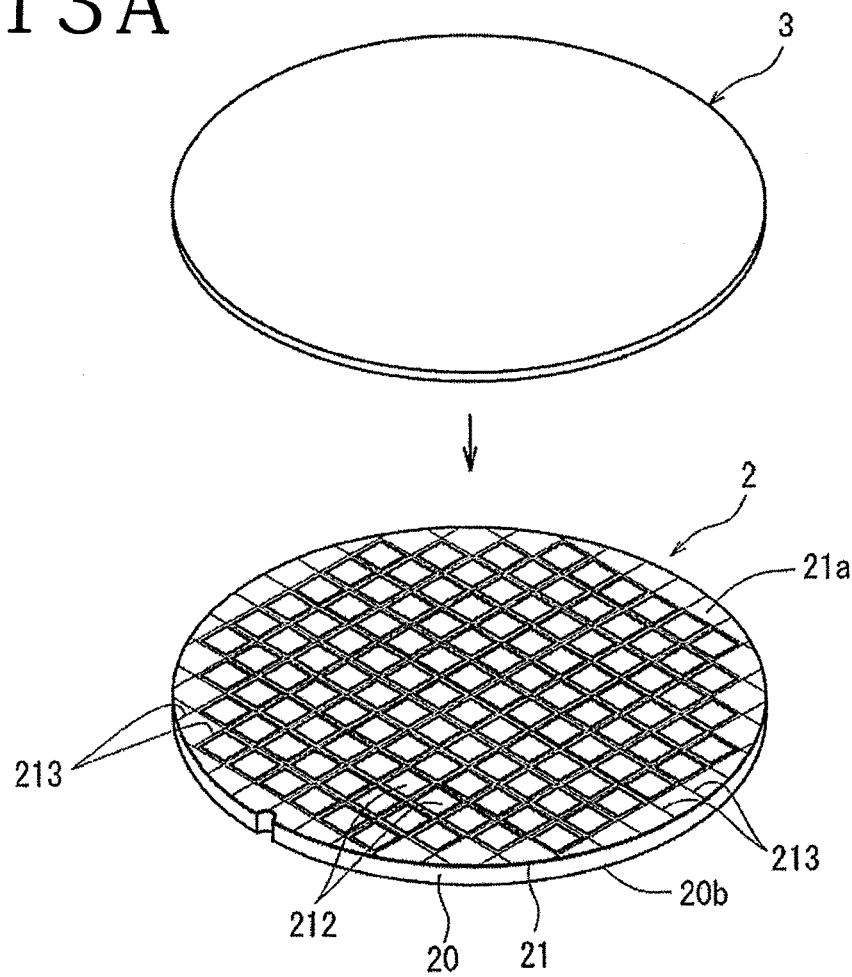
FIGS. 13A and 13B are views showing a protective tape adhering step according to the second embodiment of the present invention, of adhering a protective tape to the surface of an optical device layer of the optical device wafer shown in FIG. 1A.
Figure 13B:
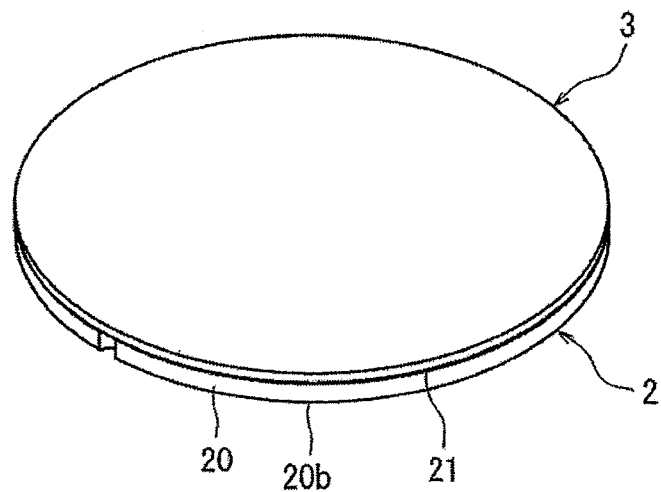

After the above film removing step has been performed, a protective tape adhering step is carried out to adhere a protective tape to the surface 21a of the optical device layer 21 of the optical device wafer 2 in order to protect the optical devices 212 formed on the surface 21a of the optical device layer 21. Specifically, as shown in FIGS. 13A and 13B, a protective tape 3 is adhered to the surface 21a of the optical device layer 21 of the optical device wafer 2 on which the film removing step has been performed.

After the above protective tape adhering step has been performed, a shield tunnel forming step is carried out to apply a pulsed laser beam having such a wavelength that permeates through the sapphire ($Al_2O_3$) substrate 20 as a single-crystal substrate to the optical device wafer 2 from the reverse side thereof along the division lines 211, forming shield tunnels, each including a fine hole and an amorphous region shielding the fine hole, along the division lines 211. The shield tunnel forming step is performed using the laser processing apparatus 4 shown in FIGS. 3 through 5, forming the shield tunnels 23 in the sapphire ($Al_2O_3$) substrate 20 as a single-crystal substrate along the division lines 211, as shown in FIGS. 6A through 6E.

Figure 14:
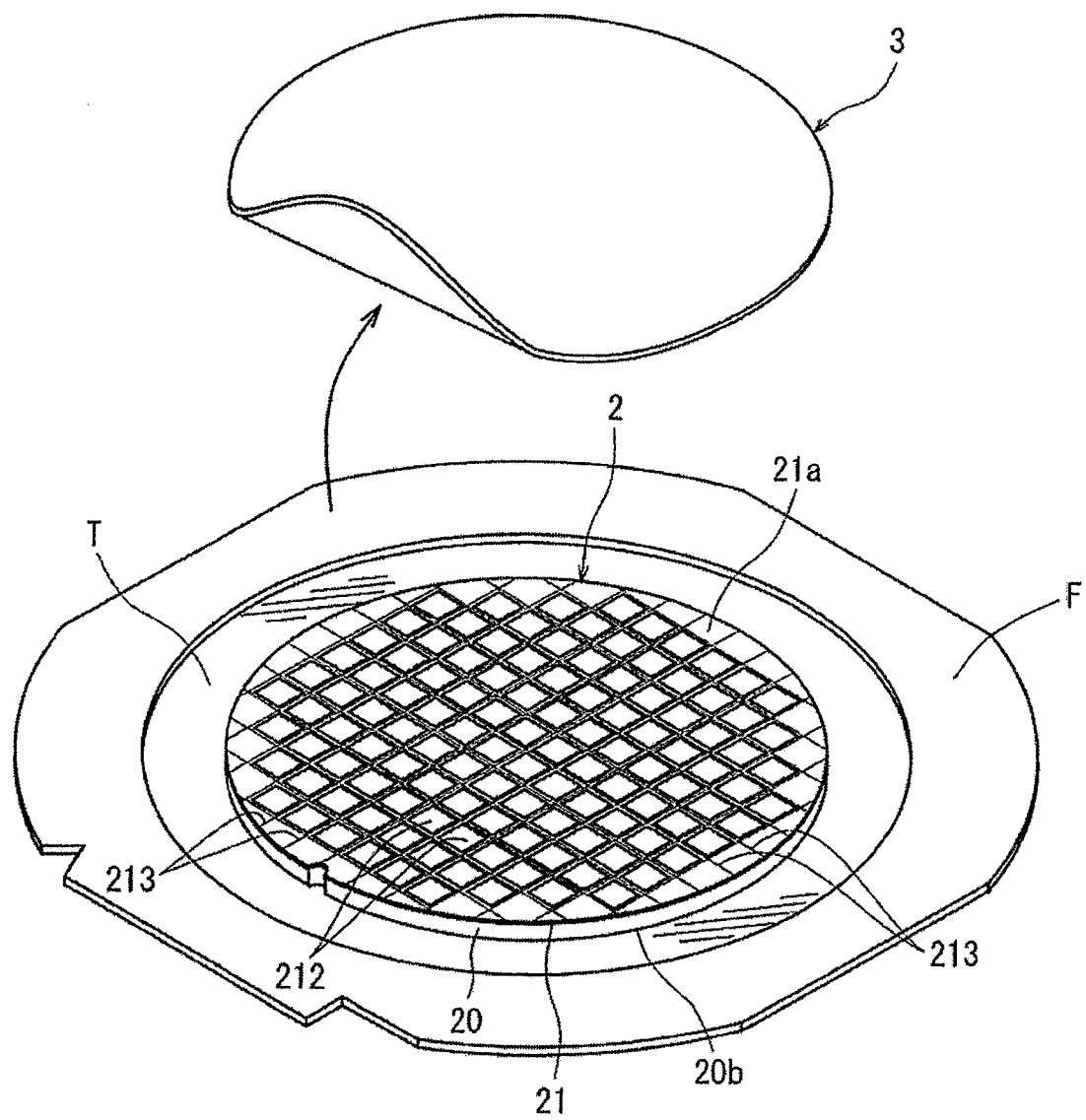
FIG. 14 is a perspective view showing the manner in which an optical device wafer on which the film removing step and the shield tunnel forming step have been performed is adhered to a dicing tape mounted on an annular frame.

Then, a wafer supporting step is carried out to adhere a dicing tape to the reverse side 20b of the sapphire ($Al_2O_3$) substrate 20 as the single-crystal substrate of the optical device wafer 2 on which the film removing step and the shield tunnel forming step have been performed, and support an outer circumferential portion of the dicing tape on an annular frame. Specifically, as shown in FIG. 14, the reverse side 20b of the sapphire (Al₂O₃) substrate 20 as the single-crystal substrate of the optical device wafer 2 on which the film removing step and the shield tunnel forming step have been performed is adhered to the surface of a dicing tape T whose outer circumferential portion has been mounted on an annular frame F in covering relation to an inner opening thereof. Then, the protective tape 3 adhered to the surface 21a of the optical device layer 21 is peeled off. With the optical device wafer 2 adhered to the surface of the dicing tape T, therefore, the optical device layer 21 has its surface 21a facing upwardly.

After the above wafer supporting step has been carried out, a wafer dividing step is performed to apply an external force to the optical device wafer 2 to divide the optical device wafer 2 along the division lines 211 where the shield tunnels 23 including the fine holes 231 and the amorphous regions 232 formed around the fine holes 231 have been successively formed, into individual optical devices 212. The wafer dividing step is carried out using the dividing apparatus 6 shown in FIG. 10, as shown in FIGS. 11A through 11C.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a single-crystal substrate, having a film deposited on a front surface side thereof to divide the single-crystal substrate along a plurality of preset division lines, wherein the single-crystal substrate also includes a reverse side that is opposite of the surface including the film deposited thereon, the method comprising:
    a holding step of holding the front surface side having the film deposited thereon of the single-crystal substrate by a chuck table of a laser processing apparatus with the reverse side of the single-crystal substrate facing upward;
    a shield tunnel forming step of applying a pulsed laser beam having such a wavelength that transmits through the single-crystal substrate to the single-crystal substrate from the reverse side thereof along the division lines to form shield tunnels, each including a fine hole and an amorphous region shielding the fine hole, in the single-crystal substrate along the division lines, after performing the holding step;
    a film removing step of holding the single-crystal substrate by a chuck table of a cutting apparatus with the film deposited on the front surface side of the single-crystal substrate facing upward and removing the film deposited on the single-crystal substrate along the division lines, the film removing step being performed by a cutting blade with an annular cutter on an outer circumference thereof; and
    a dividing step of exerting an external force on the single-crystal substrate upon which the shield tunnel forming step and the film removing step were performed to divide the single-crystal substrate along the division lines along which the shield tunnels have been formed.

2. The method of processing a single-crystal substrate according to claim 1, wherein the pulsed laser beam used in the shield tunnel forming step has a peak energy density set to a value in a range from 1 TW/cm² to 100 TW/cm².

3. The method of processing a single-crystal substrate according to claim 1, wherein the converged point of the pulsed laser beam is set to be spaced from the reverse side of the single crystal substrate by between 5 μm and 10 μm.

4. The method of processing a single-crystal substrate according to claim 1, wherein the film comprises an optical device layer.

5. The method of processing a single-crystal substrate according to claim 1, wherein the film removing step results in the formation of a groove within the film along each of the division lines, wherein each of the grooves reaches the surface of the single-crystal substrate.

6. The method of processing a single-crystal substrate according to claim 4, wherein the film removing step results in the formation of a groove within the film along each of the division lines, wherein each of the grooves reaches the surface of the single-crystal substrate.

7. The method of processing a single-crystal substrate according to claim 1, further comprising:
    a protective tape adhering step of adhering a protective tape to the film, wherein the protective tape adhering step is performed before the shield tunnel forming step; and
    a step of peeling off the protective tape, wherein the step of peeling off the protective tape is performed after the shield tunnel forming step and before the film removing step.

8. The method of processing a single-crystal substrate according to claim 4, further comprising:
    a protective tape adhering step of adhering a protective tape to the film, wherein the protective tape adhering step is performed before the shield tunnel forming step; and
    a step of peeling off the protective tape, wherein the step of peeling off the protective tape is performed after the shield tunnel forming step and before the film removing step.

9. The method of processing a single-crystal substrate according to claim 5, further comprising:
    a protective tape adhering step of adhering a protective tape to the film, wherein the protective tape adhering step is performed before the shield tunnel forming step; and
    a step of peeling off the protective tape, wherein the step of peeling off the protective tape is performed after the shield tunnel forming step and before the film removing step.

10. The method of processing a single-crystal substrate according to claim 1, further comprising:
    a protective tape adhering step of adhering a protective tape to the film, wherein the protective tape adhering step is performed after the film removing step and before the shield tunnel forming step; and
    a step of peeling off the protective tape, wherein the step of peeling off the protective tape is performed after the shield tunnel forming step.

11. The method of processing a single-crystal substrate according to claim 4, further comprising:
    a protective tape adhering step of adhering a protective tape to the film, wherein the protective tape adhering step is performed after the film removing step and before the shield tunnel forming step; and
    a step of peeling off the protective tape, wherein the step of peeling off the protective tape is performed after the shield tunnel forming step.

12. The method of processing a single-crystal substrate according to claim 5, further comprising:
- a protective tape adhering step of adhering a protective tape to the film, wherein the protective tape adhering step is performed after the film removing step and before the shield tunnel forming step; and
- a step of peeling off the protective tape, wherein the step of peeling off the protective tape is performed after the shield tunnel forming step.

13. The method of processing a single-crystal substrate according to claim 1, wherein each of the fine holes formed during the shield tunnel forming step extend from the reverse side of the single-crystal substrate toward the surface of the single-crystal substrate including the film deposited thereon.

* * * * *